(12) United States Patent
Chang et al.

(10) Patent No.: US 11,831,278 B2
(45) Date of Patent: Nov. 28, 2023

(54) VOLTAGE-CONTROLLED OSCILLATOR DEVICE

(71) Applicant: INDUSTRIAL TECHNOLOGY RESEARCH INSTITUTE, Hsinchu (TW)

(72) Inventors: Chih-Hsiang Chang, Zhubei (TW); Yu Lee, Hsinchu County (TW); Hua-Shan Hu, Taichung (TW); Ching-Yuan Yang, Taichung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 17/886,143

(22) Filed: Aug. 11, 2022

(65) Prior Publication Data

US 2023/0198467 A1   Jun. 22, 2023

(30) Foreign Application Priority Data

Dec. 21, 2021   (TW) .................................. 110147895

(51) Int. Cl.
  *H03B 7/06*  (2006.01)
  *H03B 5/12*  (2006.01)
  *H03B 19/00*  (2006.01)

(52) U.S. Cl.
  CPC .............. *H03B 7/06* (2013.01); *H03B 5/1212* (2013.01); *H03B 5/1228* (2013.01);
  (Continued)

(58) Field of Classification Search
  CPC .. H03B 7/06; H03B 19/00; H03B 2200/0072; H03B 5/1243; H03B 5/1265; H03B 5/1212; H03B 5/1228
  (Continued)

(56) References Cited

U.S. PATENT DOCUMENTS 7,319,366 B2 * 1/2008 Oh .................... H03B 27/00
                                                      331/37
7,583,156 B2   9/2009 Hung et al.
(Continued)

FOREIGN PATENT DOCUMENTS

CN     107437938 A    12/2017
CN     207926527 U     9/2018
(Continued)

OTHER PUBLICATIONS

Guo et al., "A 0.08mm2 25.5-to-29.9GHz Multi-Resonant-RLCM-Tank VCO Using a Single-Turn Multi-Tap Inductor and CM-Only Capacitors Achieving 191.6dBc/Hz FoM and 130KHz 1/f3 PN Corner" 2019.
(Continued)

*Primary Examiner* — Arnold M Kinkead
(74) *Attorney, Agent, or Firm* — Maschoff Brennan

(57) ABSTRACT

A voltage-controlled oscillator device includes first and second voltage-controlled oscillators, a first switch group including two first switches, and a second switch group including two second switches. The first voltage-controlled oscillator includes a first inductor group, a first negative resistance circuit and a first voltage output terminal group. The second voltage-controlled oscillator includes a second inductor group, a second negative resistance circuit and a second voltage output terminal group. For the first switch group, first control terminals are electrically connected to the first voltage output terminal group, first input terminals are electrically connected to the second voltage output terminal group, first output terminals are electrically connected. For the second switch group, second control terminals are electrically connected to the second voltage output terminal group, second input terminals are electrically connected to
(Continued)

the first voltage output terminal group, second output terminals are electrically connected.

13 Claims, 7 Drawing Sheets

(52) U.S. Cl.
CPC ......... *H03B 5/1243* (2013.01); *H03B 5/1265* (2013.01); *H03B 19/00* (2013.01); *H03B 2200/0072* (2013.01)

(58) Field of Classification Search
USPC .............................................. 331/46, 2, 167
See application file for complete search history.

(56) References Cited

U.S. PATENT DOCUMENTS

| | | |
|---|---|---|
| 8,067,987 B2 | 11/2011 | Sen |
| 8,779,865 B2 | 7/2014 | Rylyakov |
| 9,197,222 B2 | 11/2015 | Rehman |
| 2002/0001361 A1 | 1/2002 | Ueno et al. |
| 2011/0175651 A1 | 7/2011 | Chang et al. |
| 2016/0126959 A1 | 5/2016 | Chang et al. |
| 2019/0341886 A1* | 11/2019 | Oredsson ................ H03L 7/099 |
| 2020/0112286 A1 | 4/2020 | Chakraborty |
| 2021/0234508 A1 | 7/2021 | Lin et al. |

FOREIGN PATENT DOCUMENTS

| | | | |
|---|---|---|---|
| TW | 201506963 A | 6/2010 | |
| TW | 201909550 A | 7/2011 | |
| WO | WO-2011127754 A1 * | 10/2011 | ............. H03B 19/00 |

OTHER PUBLICATIONS

Chang et al., "A 0.18-μm CMOS 16-GHz Varactorless LC-VCO with 1.2-GHz Tuning Range" Nov. 12, 2007.
Lee et al.,, "A 2.7 GHZ to 7 GHz Fractional-N LC-PLL Utilizing Multi-Metal Layer SoC Technology in 28 nm CMOS" Apr. 2015.
Deng et al., "A 25MHz-6.44GHz LC-VCO Using a 5-port Inductor for Multiband Frequency Generation" 2011.
Forsberg et al., "A 65 nm CMOS varactorless mm-wave VCO" 2014.
Borremans et al., "A Single-Inductor, Dual-Band VCO in a 0.06 mm2 , 5.6 GHz Multi-Band Front-End in 90nm Digital CMOS" 2008.
Zou et al., "An Area-Efficient 5ghz/10ghz Dual-Mode Vco With Coupled Helical Inductors In 0.13-Um Cmos" 2011 Technology.
Taiwan Office Action dated Jun. 20, 2022 as received in application No. 110147895.

* cited by examiner

VOLTAGE-CONTROLLED OSCILLATOR DEVICE

CROSS-REFERENCE TO RELATED APPLICATIONS

This non-provisional application claims priority under 35 U.S.C. § 119(a) on Patent Application No(s). 110147895 filed in Republic of China (ROC) on Dec. 21, 2021, the entire contents of which are hereby incorporated by reference.

BACKGROUND

1. Technical Field

This disclosure relates to a voltage-controlled oscillator device.

2. Related Art

Recently, as the use of semiconductor devices increases, the bandwidth requirements of operating frequencies of the semiconductor devices are also increasing. Therefore, many manufacturers use a voltage-controlled oscillator (VCO) to control the oscillation frequency of the circuit, to provide stable and adjustable operating frequency. Some VCOs modulate the oscillation frequency by adjusting the variable capacitance and driving voltage, thereby meeting various bandwidth requirements.

There are also voltage-controlled oscillator devices on the market that is composed of a plurality of voltage-controlled oscillators, a plurality of high-speed multiplexers (MUXs), and a plurality of buffers. One of these VCOs with different inductance values is actuated through the selection function of the multiplexer, so that the output of the VCO device may cover a wider frequency bandwidth.

SUMMARY

Accordingly, this disclosure provides a voltage-controlled oscillator device.

According to one or more embodiment of this disclosure, a comprises: a first voltage-controlled oscillator at least comprising a first inductor group, a first negative resistance circuit, and a first voltage output terminal group, wherein the first voltage output terminal group is located between the first inductor group and the first negative resistance circuit; a second voltage-controlled oscillator at least comprising a second inductor group, a second negative resistance circuit, and a second voltage output terminal group, wherein the second voltage output terminal group is located between the second inductor group and the second negative resistance circuit; a first switch group comprising two first switches, each of the two first switches comprising a first control terminal, a first input terminal and a first output terminal, wherein the two first control terminals are electrically connected to the first voltage output terminal group, the two first input terminals are electrically connected to the second voltage output terminal group, and the two first output terminals are electrically connected and selectively electrically grounded; and a second switch group comprising two second switches, each of the second switches comprising a second control terminal, a second input terminal and a second output terminal, wherein the two second control terminals are electrically connected to the second voltage output terminal group, the two second input terminals are electrically connected to the first voltage output terminal group, and the two second output terminals are electrically connected and selectively electrically grounded, wherein a first voltage terminal of the second inductor group is electrically connected to a second voltage terminal of the first negative resistance circuit.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present invention. The following embodiments further illustrate various aspects of the present invention, but are not meant to limit the scope of the present invention. Terms "coupled" or "electrically connected" described herein may indicate direct connection or indirect connection through other element. For example, the first element is coupled (or electrically connected) to the second element may indicate the first element is directly connected to the second element. The first element is coupled (or electrically connected) to the second element may also indicate the first element is indirectly connected the second element through a third element and/or other element, for example, the first element is directly connected to the third element and the third element is directly connected to the second element. Or, for example, the first element is electrically grounded may indicate the first element is directly grounded. The first element is electrically grounded may also indicate the first element is indirectly grounded through a fourth element and/or other element, for example, the first element is directly connected to the fourth element, and the fourth element is directly grounded.

Figure 1:
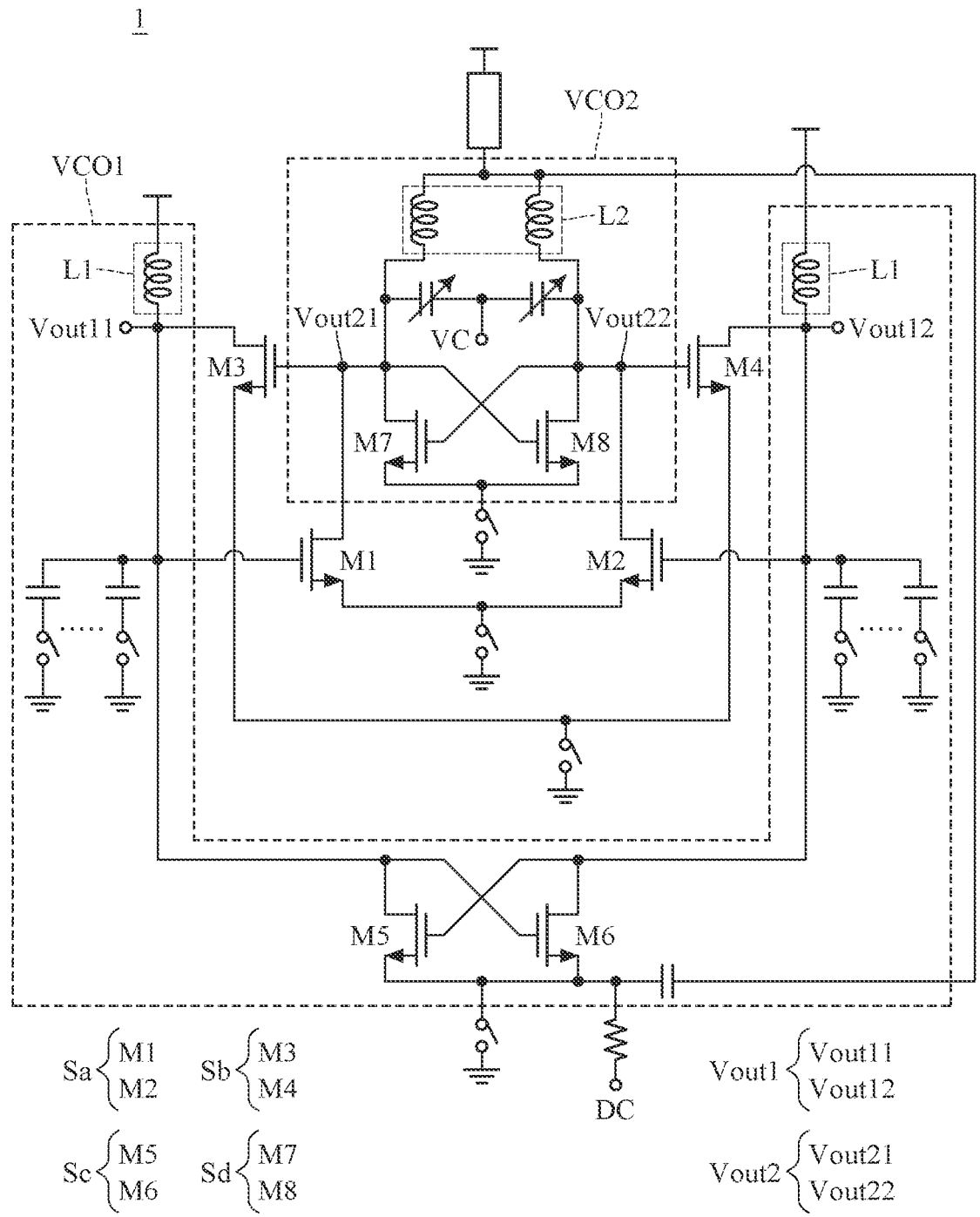
FIG. 1 is a circuit diagram illustrating a voltage-controlled oscillator device according to embodiments of the present disclosure.

Please refer to FIG. 1. FIG. 1 is a circuit diagram illustrating a voltage-controlled oscillator device according to embodiments of the present disclosure. According to an embodiment of the present disclosure The voltage-controlled oscillator device 1 may include a first voltage-controlled oscillator VCO1, a second voltage-controlled oscillator VCO2, a first switch group Sa and a second switch group Sb. The voltage-controlled oscillator may be a LC oscillator. The switch group may be implemented by two transistors. The transistor described herein may be implemented by metal-oxide-semiconductor field-effect transistor (MOSFET), the transistor described herein may also be implemented by bipolar junction transistor (BJT) or other transistors. The structure of the voltage-controlled oscillator device 1 may be shown as FIG. 1.

Figure 2:
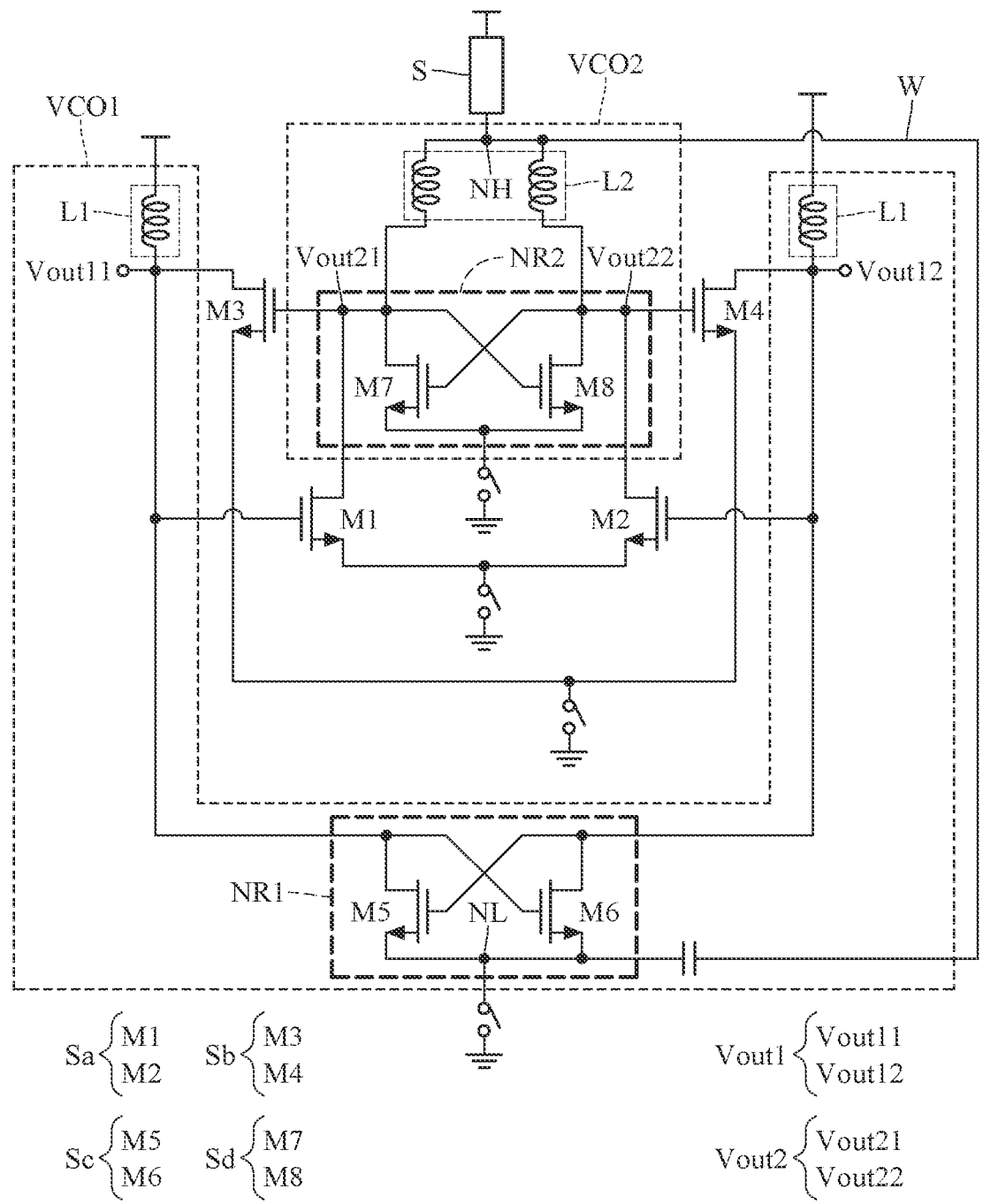
FIG. 2 is a circuit diagram illustrating a voltage-controlled oscillator device according to an embodiment of the present disclosure.

To explain the voltage-controlled oscillator device 1 according to an embodiment of the present disclosure, please refer to FIG. 2. FIG. 2 is a circuit diagram illustrating a voltage-controlled oscillator device according to an embodiment of the present disclosure, wherein the voltage-controlled oscillator device 1 shown in FIG. 2 is a simplified version of the voltage-controlled oscillator device 1 shown in FIG. 1, or is another embodiment of the voltage-controlled oscillator device 1. The following description focuses on inductors in the voltage-controlled oscillator device 1. Therefore, in FIG. 2, capacitors in the first voltage-controlled oscillator VCO1 and a second voltage-controlled oscillator VCO2 are omitted from the voltage-controlled oscillator device 1.

As shown in FIG. 2, the first voltage-controlled oscillator VCO1 includes a first inductor group L1 and a first negative resistance circuit NR1, and includes a first voltage output terminal group Vout1, wherein the first voltage output terminal group Vout1 is located between the first inductor group L1 and the first negative resistance circuit NR1, and voltages of the two nodes in the first inductor group L1 not connected to the first voltage output terminal group Vout1 may be substantially the same. The first voltage output terminal group Vout1 includes a first positive voltage output terminal Vout11 and a first negative voltage output terminal Vout12. The first positive voltage output terminal Vout11 is located between one of the inductor among the inductors of the first inductor group L1 and the first negative resistance circuit NR1. The first negative voltage output terminal Vout12 is located between another inductor among the inductors of the first inductor group L1 and the first negative resistance circuit NR1. The first inductor group L1 may be implemented by two independent inductors, or by symmetric inductors having mutual inductance effect. The structure of the first negative resistance circuit NR1 is, for example, a cross-coupled pair circuit structure. With positive feedback loop formed with this cross-coupled pair circuit structure, a negative resistance is generated to offset the parasitic resistance of the inductor in the circuit. By using symmetric inductors having mutual inductance effect, the value of the negative resistance is changed by the first negative resistance circuit NR1, thereby changing a value of mutual inductance in the inductors to achieve an adjustable frequency range. Therefore, there may be no need to add a variable capacitor to change the frequency. In addition, the first voltage output terminal group Vout1 is the signal output terminal of the voltage-controlled oscillator device 1, and the signal with modulated frequency is outputted from the first voltage output terminal group Vout1.

The second voltage-controlled oscillator VCO2 includes a second inductor group L2 and a second negative resistance circuit NR2 and includes a second voltage output terminal group Vout2, wherein the second voltage output terminal group Vout2 includes a second positive voltage output terminal Vout21 and a second negative voltage output terminal Vout22. The second voltage output terminal group Vout2 is located between the second inductor group L2 and the second negative resistance circuit NR2, and voltages of two nodes in the second inductor group L2 not connected to the second voltage output terminal group Vout2 may be substantially the same (that is, a first voltage terminal NH, and the first voltage terminal NH may be a high voltage terminal). That is, the second positive voltage output terminal Vout21 is connected to one inductor among the second inductor group L2, and the second negative voltage output terminal Vout22 is connected to another inductor among the second inductor group L2. The structure of the second voltage-controlled oscillator VCO2 may be the same with that of the first voltage-controlled oscillator VCO1, the detail structure of the second voltage-controlled oscillator VCO2 is not repeated herein. Inductance value, resistance value and capacitance value of each element in the first voltage-controlled oscillator VCO1 and in the second voltage-controlled oscillator VCO2 may be the same or different, said inductance value, resistance value and capacitance value may be adjusted for the voltage-controlled oscillator device 1 to output signals with different frequencies.

The first switch group Sa includes two first switches M1, M2, and each of the two first switches M1, M2 includes a first control terminal, a first input terminal and a first output terminal. In an embodiment, the first switch group Sa may be implemented by NMOSFET (referred to as "NMOS" herein), the first control terminal may be a gate, the first input terminal may be a drain, and the first output terminal may be a source. In an embodiment, the first switch group Sa is implemented by PMOSFET (referred to as "PMOS" herein), the first control terminal may be a gate, the first input terminal may be a source, and the first output terminal may be a drain. The first control terminals of the first switches M1, M2 are electrically connected to the first voltage output terminal group Vout1; the first input terminal of the first switches M1, M2 are electrically connected to the second voltage output terminal group Vout2; the first output terminal of the first switch M1 and the first output terminal of the first switch M2 are electrically connected and are selectively grounded or selectively electrically grounded. Said "the first output terminal of the first switch M1 and the first output terminal of the first switch M2 are electrically connected and are selectively grounded or selectively electrically grounded" may indicate the voltage of the first output terminal of the first switch M1 and the voltage of the first output terminal of the first switch M2 may be substantially the same. In an embodiment, whether the first output terminal of the first switch M1 and the first output terminal of the first switch M2 are grounded (or electrically grounded) may allow the second voltage-controlled oscillator VCO2 to be used as a frequency doubler when the first voltage-controlled oscillator VCO1 operates as a voltage-controlled oscillator, wherein the implementation of the second voltage-controlled oscillator VCO2 used as the frequency doubler is described below.

The second switch group Sb includes two second switches M3, M4, and each of the two second switches M3, M4 includes a second control terminal, a second input terminal and a second output terminal. In an embodiment, the second switch group Sb is implemented by NMOS, wherein the second control terminal may be a gate, the second input terminal may be a drain, and the second output terminal may be a source. In an embodiment, the second switch group Sb is implemented by PMOS, wherein the second control terminal may be a gate, the second input terminal may be a source, and the second output terminal may be a drain. The second control terminals of the second switches M3, M4 are respectively electrically connected to the second positive voltage output terminal Vout21 and the second negative voltage output terminal Vout22 of the second voltage output terminal group Vout2; the second input terminals of the second switches M3, M4 are respectively electrically connected to the first positive voltage output terminal Vout11 and the first negative voltage output terminal Vout12 of the first voltage output terminal group Vout1; the second output terminal of the second switch M3 and the second output terminal of the second switch M4 are electrically connected and are selectively grounded or selectively electrically grounded. Said "the second output terminal of the second switch M3 and the second output terminal of the second switch M4 are electrically connected and are selectively grounded or selectively electrically grounded" may indicate the voltage of the second output terminal of the second switch M3 and the voltage of the second output terminal of the second switch M4 may be substantially the same. In an embodiment, grounding (or electrically grounding) the second output terminal of the second switch M3 and the second output terminal of the second switch M4 may allow the first inductor group L1 of the first voltage-controlled oscillator VCO1 to be used as a buffer when the second voltage-controlled oscillator VCO2 operates as a voltage-controlled oscillator, wherein the implementation of the first inductor group L1 used as the buffer is described below.

Further, the second voltage terminal NL of the first negative resistance circuit NR1 is electrically connected to the first voltage terminal NH of the second inductor group L2 (for example, connected through a wire W). The second voltage terminal NL is a node of the first negative resistance circuit NR1 not connected to the first voltage output terminal group Vout1, and the first voltage terminal NH (for example, high voltage terminal) is a node having a voltage that is substantially the same with the second voltage terminal NL in the second inductor group L2 not connected to the second voltage output terminal group Vout2. The first voltage terminal NH (for example, high voltage terminal) may be coupled to a power input source S, wherein the power input source S may be a power source (for example, current source, voltage source (Vdd)) or a passive element (for example, capacitor, inductor) connected to a voltage source etc.

In an embodiment, the first negative resistance circuit NR1 includes a third switch group Sc, the third switch group Sc includes two third switches M5, M6, and each of the two third switches M5, M6 includes a third control terminal, a third input terminal and a third output terminal. In an embodiment, the third switch group Sc is implemented by NMOS, wherein the third control terminal may be a gate, the third input terminal may be a drain, and the third output terminal may be a source. In an embodiment, the third switch group Sc is implemented by PMOS, wherein the third control terminal may be a gate, the third input terminal may be a source, and the third output terminal may be a drain. The control terminal of the third switch M5 is electrically connected to the third input terminal of the third switch M6, the third control terminal of the third switch M6 is electrically connected to the third input terminal of the third switch M5, and the third input terminals of the two third switches M5, M6 are further electrically connected to the first voltage output terminal group Vout1 (that is, the third input terminal of the third switch M5 and the second input terminal of the second switch M3 are electrically connected to the first positive voltage output terminal Vout11, and the third input terminal of the third switch M6 and the second input terminal of the second switch M4 are electrically connected to the first negative voltage output terminal Vout12). The third output terminal of the third switch M5 and the third input terminal of the third switch M6 are electrically connected and are selectively grounded or selectively electrically grounded, wherein the third output terminal of the third switch M5 and the third input terminal of the third switch M6 are electrically connected to the second voltage terminal NL (for example, low voltage terminal). Similarly, said "the third output terminal of the third switch M5 and the third input terminal of the third switch M6 are electrically connected and are selectively grounded or selectively electrically grounded" may indicate the voltage of the third output terminal of the third switch M5 and the voltage of the third input terminal of the third switch M6 may be substantially the same. In an embodiment, when the third output terminal of the third switch M5 and the third input terminal of the third switch M6 are grounded or electrically grounded, the first voltage-controlled oscillator VCO1 may be enabled.

In an embodiment, the second negative resistance circuit NR2 includes a fourth switch group Sd, and the fourth switch group Sd includes two fourth switches M7, M8, and each of the two fourth switches M7, M8 includes a fourth control terminal, a fourth input terminal and a fourth output terminal. In an embodiment, the fourth switch group Sd is implemented by NMOS, wherein the fourth control terminal may be a gate, the fourth input terminal may be a drain, and the fourth output terminal may be a source. In an embodiment, the fourth switch group Sd is implemented by PMOS, wherein the fourth control terminal may be a gate, the fourth input terminal may be a source, and the fourth output terminal may be a drain. The fourth control terminal of the fourth switch M7 is electrically connected to the fourth input terminal of the fourth switch M8, the fourth control terminal of the fourth switch M8 is electrically connected to the fourth input terminal of the fourth switch M7, and the fourth input terminals of the fourth switches M7, M8 are further electrically connected to the second voltage output terminal group Vout2 (that is, the fourth input terminal of the fourth switch M7 and the second control terminal of the second switch M3 are electrically connected to the second positive voltage output terminal Vout21, the fourth input terminal of the fourth switch M8 and the second control terminal of the second switch M4 are electrically connected to the second negative voltage output terminal Vout22). In an embodiment, when the fourth output terminal of the fourth switch M7 and the fourth output terminal of the fourth switch M8 are grounded or electrically grounded, the second voltage-controlled oscillator VCO2 may be enabled.

In an embodiment, a capacitor may be further be disposed between the first voltage terminal NH and the second voltage terminal NL, such that the current signal flowing through the wire W may be alternating current.

Figure 3A:
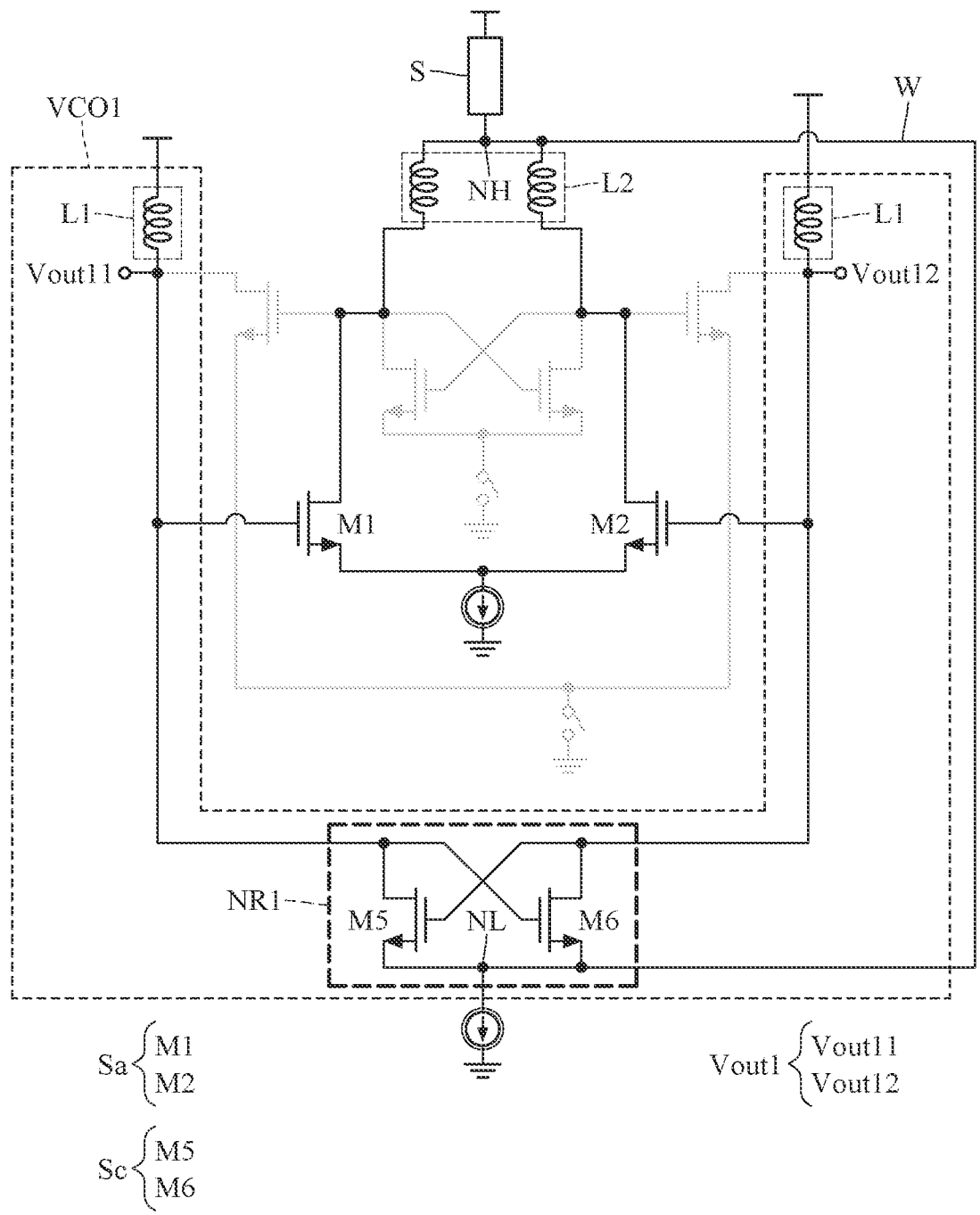
FIG. 3A illustrates elements in operation during the voltage-controlled oscillator device outputs signals in a first frequency according to an embodiment of the present disclosure.
Figure 3B:
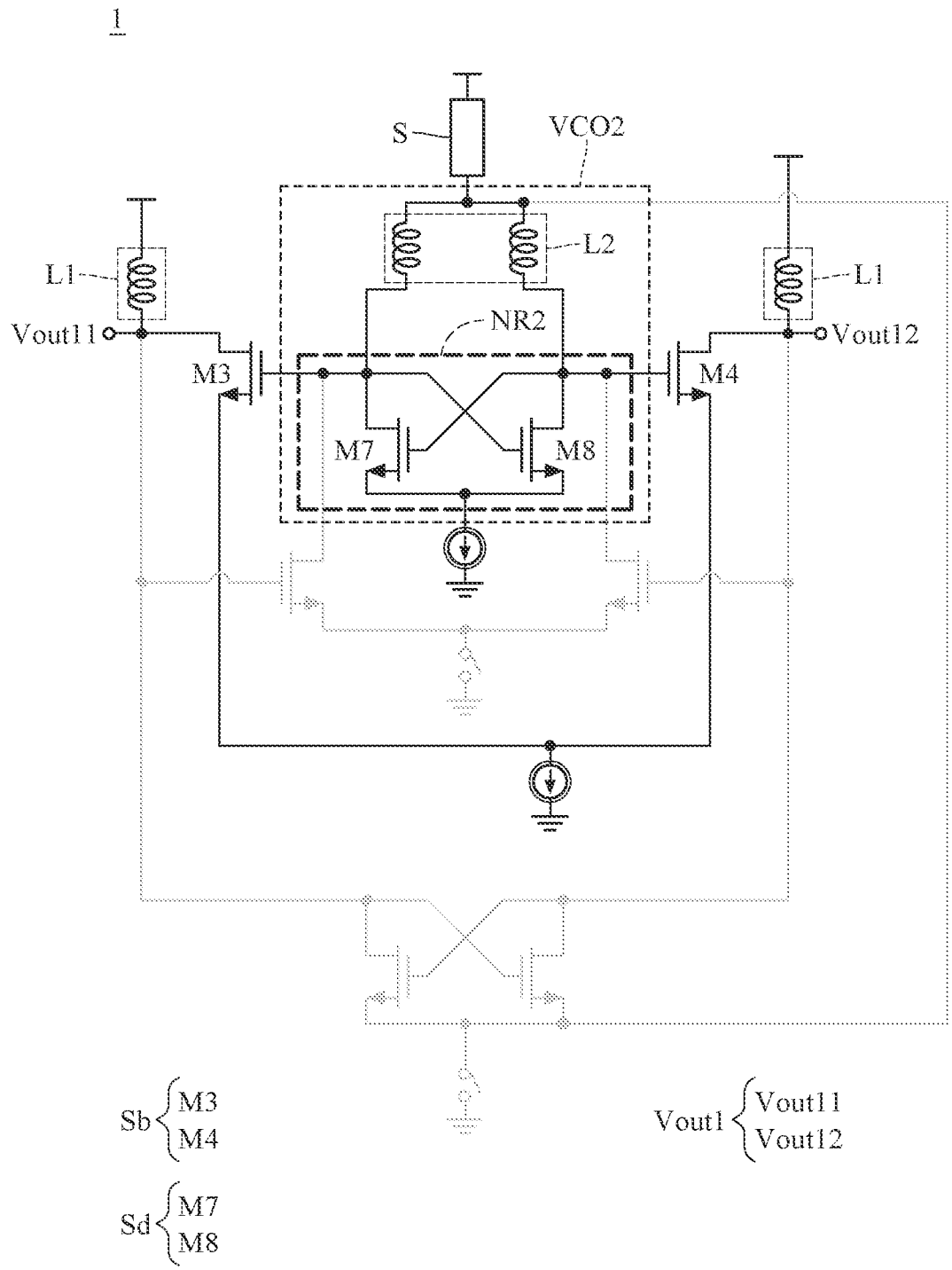
FIG. 3B illustrates elements in operation during the voltage-controlled oscillator device outputs signals in a second frequency according to an embodiment of the present disclosure.

The following describes the operation state of the voltage-controlled oscillator device 1 based on FIG. 3A and FIG. 3B, wherein the description of FIG. 3A and FIG. 3B uses switches M1 to M8 implemented by NMOS as an example. In an embodiment, the switch between operation states of the voltage-controlled oscillator device 1 depends on the required inductance frequency. FIG. 3A and FIG. 3B illustrate the structure of the voltage-controlled oscillator device 1 with different gray scales to show different operating states of the voltage-controlled oscillator device 1. That is, the illustrations of FIG. 3A and FIG. 3B are for the purpose of highlighting the corresponding elements in operation in the voltage-controlled oscillator device 1 when the voltage-controlled oscillator device 1 outputs signals of different frequencies.

Please refer to both FIG. 2 and FIG. 3A, wherein FIG. 3A illustrates elements in operation during the voltage-controlled oscillator device outputs signals in a first frequency according to an embodiment of the disclosure. Specifically, assuming the required frequency of output signal of the voltage-controlled oscillator device 1 is 5 GHz, in FIG. 2, the two first output terminals of the first switches M1, M2 and the ground are conducted; the two second output terminals of the second switches M3, M4 and the ground are disconnected; the two third output terminals of the third switches M5, M6 and the ground are conducted; the two fourth output terminals of the fourth switches M7, M8 and the ground are disconnected. Controlling the conduction or disconnection between each switch and the ground described above forms the schematic diagram as shown in FIG. 3A. An inductance value of the first voltage-controlled oscillator VCO1 is an inductance value of the first inductor group L1. Under this circumstance, the first voltage-controlled oscillator VCO1 operates as a voltage-controlled oscillator to modulate the oscillation frequency, and outputs a signal with a first frequency (for example, 5 GHz as described above) through the first voltage output terminal group Vout1. Meanwhile, the first negative resistance circuit NR1 and the first inductor group L1 may operate as frequency doublers. In other words, under this circumstance, the first voltage-controlled oscillator VCO1 is a frequency doubler, and the second voltage-controlled oscillator VCO2 does not operate. According to an embodiment of the present disclosure, through the structure of the voltage-controlled oscillator device 1, a frequency doubler may be implemented and phase noise in the output signal of the first voltage-controlled oscillator VCO1 may be suppressed at the same time. That is, embodiments of the present disclosure may suppress phase noise and adjusting the phase noise in the signal to be close to the phase noise in the modulated signal received by the switches M1, M2 through electrically connecting the second voltage terminal NL of the first negative resistance circuit NR1 (low voltage terminal) and the first voltage terminal NH of the second inductor group L2 (high voltage terminal).

Please refer to both FIG. 2 and FIG. 3B, wherein FIG. 3B illustrates elements in operation during the voltage-controlled oscillator device outputs signals in a second frequency according to an embodiment of the present disclosure. On the other hand, if the required frequency of the output signal of the voltage-controlled oscillator device 1 is a second frequency (for example, frequency of 10 GHz, which is higher than the first frequency), the two first output terminals of the first switches M1, M2 and the ground are disconnected; the two second output terminals of the second switches M3, M4 and the ground are conducted; the two third output terminals of the third switches M5, M6 and the ground are disconnected; the two fourth output terminals of the fourth switches M7, M8 and the ground are conducted. The schematic diagram in FIG. 3B is formed by controlling the conduction or disconnection between each switch and the ground as described above. An inductance value of the second voltage-controlled oscillator VCO2 is an inductance value of the second inductor group L2. Under this circumstance, the second voltage-controlled oscillator VCO2 operates as a voltage-controlled oscillator to modulate the oscillation frequency, and outputs a signal with the second frequency (for example, 10 GHz as described above) through the first voltage output terminal group Vout1. The first inductor group L1 may be a buffer to maintain a voltage level of the output signal of the second voltage-controlled oscillator VCO2. In the above two embodiments with low frequency and high frequency, the conduction or disconnection between each of the output terminal and the ground may be implemented by a single cut switch or a transistor.

In view of the above description, an embodiment of the present disclosure uses' the inductor group to adjust the frequency of the differential output signal of the voltage-controlled oscillator device (signal outputted by two first voltage output terminal Vout11, Vout12 connecting two inductors L1), thereby providing stable and adjustable frequency. In addition, through the structure of the voltage-controlled oscillator device according to an embodiment of the present disclosure, the overall volume/area of a voltage-controlled oscillator device may be reduced while maintaining the functions of a buffer and lowering phase noise.

Figure 4:
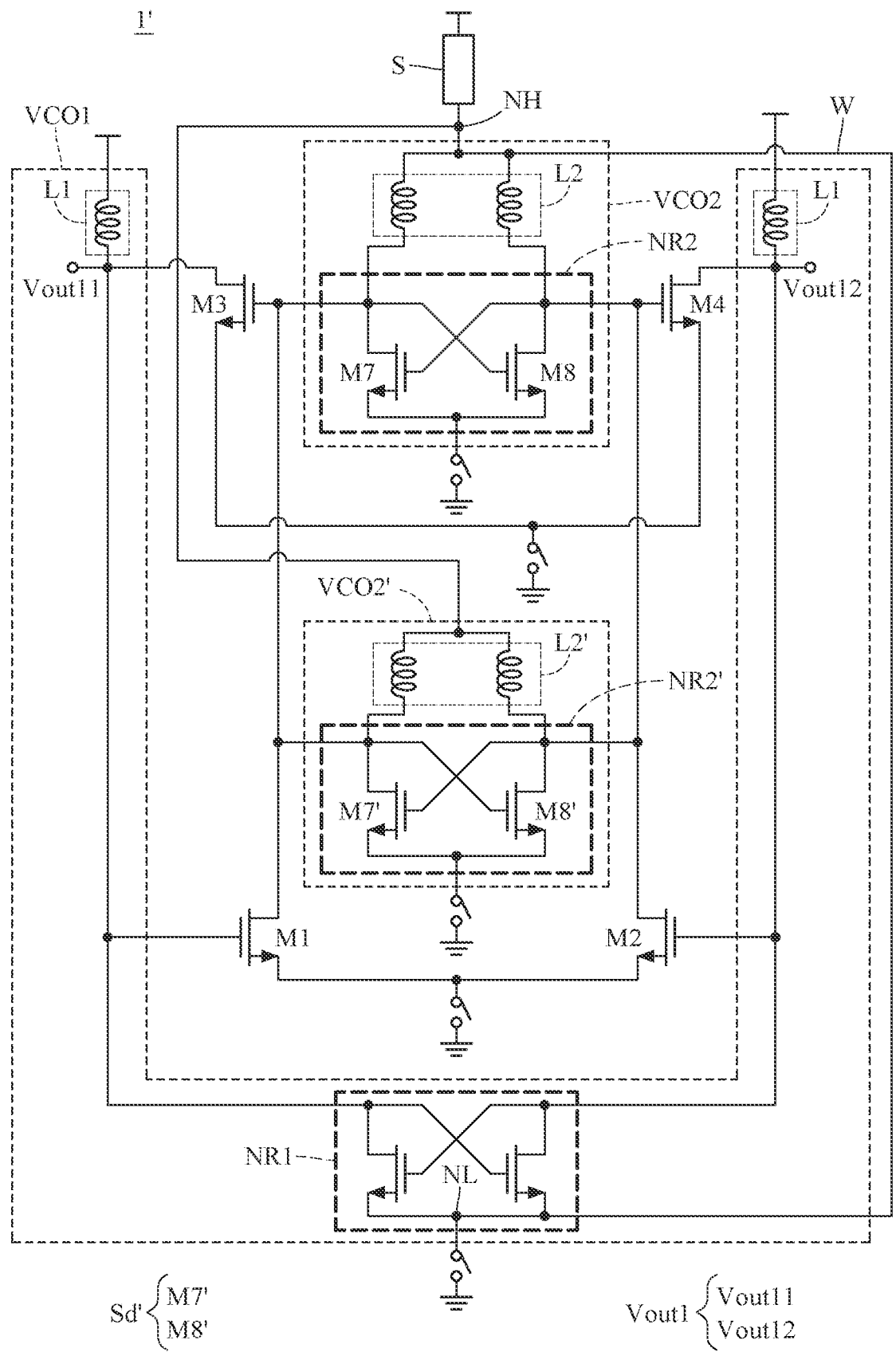
FIG. 4 is a circuit diagram illustrating a voltage-controlled oscillator device according to another embodiment of the present disclosure.

Please refer to FIG. 4. FIG. 4 is a circuit diagram illustrating a voltage-controlled oscillator device according to another embodiment of the present disclosure. The voltage-controlled oscillator device 1' shown in FIG. 4 further includes another second voltage-controlled oscillator VCO2', wherein the second voltage-controlled oscillators VCO2 and VCO2' are connected in parallel, and the second voltage-controlled oscillators VCO2 and VCO2' have the same or similar structure. The second voltage-controlled oscillator VCO2' also at least includes an inductor group and a negative resistance circuit. The second voltage-controlled oscillator VCO2' includes another second inductor group L2' and another second negative resistance circuit NR2', and the second negative resistance circuit NR2' of the second voltage-controlled oscillator VCO2' is electrically connected to the first voltage output terminal group Vout1 through the second switch group Sb. Specifically, the second negative resistance circuit NR2' includes the fourth switch group Sd', and the fourth switch group Sd' includes two fourth switches M7', M8'. Two fourth control terminals of the fourth switches M7', M8' are respectively electrically connected to the input terminal of each other. The fourth input terminal of the fourth switch M7' is electrically connected to the second inductor group L2' and the second control terminal of the second switch M3 of the second switch group Sb. The fourth input terminal of the fourth switch M8' is electrically connected to the second inductor group L2' and the second control terminal of the second switch M4 of the second switch group Sb. The fourth output terminal of the fourth switch M7' and the fourth output terminal of the fourth switch M8' are electrically connected and are selectively grounded or selectively electrically grounded. Said "the fourth output terminal of the fourth switch M7' and the fourth output terminal of the fourth switch M8' are electrically connected and are selectively grounded or selectively electrically grounded" may indicate voltage of the fourth output terminal of the fourth switch M7' and voltage of the fourth output terminal of the fourth switch M8' may be substantially the same. In an embodiment, when the fourth output terminal of the fourth switch M7' and the fourth output terminal of the fourth switch M8' are grounded or electrically grounded, the second voltage-controlled oscillator VCO2' may be enabled.

In the embodiment of FIG. 4, the first voltage terminal NH (for example, high voltage terminal) may also be connected to the second voltage terminal NL (for example, low voltage terminal) through the wire W. According to the description of embodiments regarding FIG. 4, in an embodiment, the voltage-controlled oscillator device may include a plurality of (two or more than two) second voltage-controlled oscillators connected in parallel, with all the second voltage-controlled oscillators electrically connected to the first voltage output terminal group Vout1, and these second voltage-controlled oscillators have corresponding frequencies, respectively. The corresponding frequencies of these second voltage-controlled oscillators may be different. In an embodiment, the bandwidth of the voltage-controlled oscillator device and the numbers of oscillating frequencies may be increased.

Figure 5:
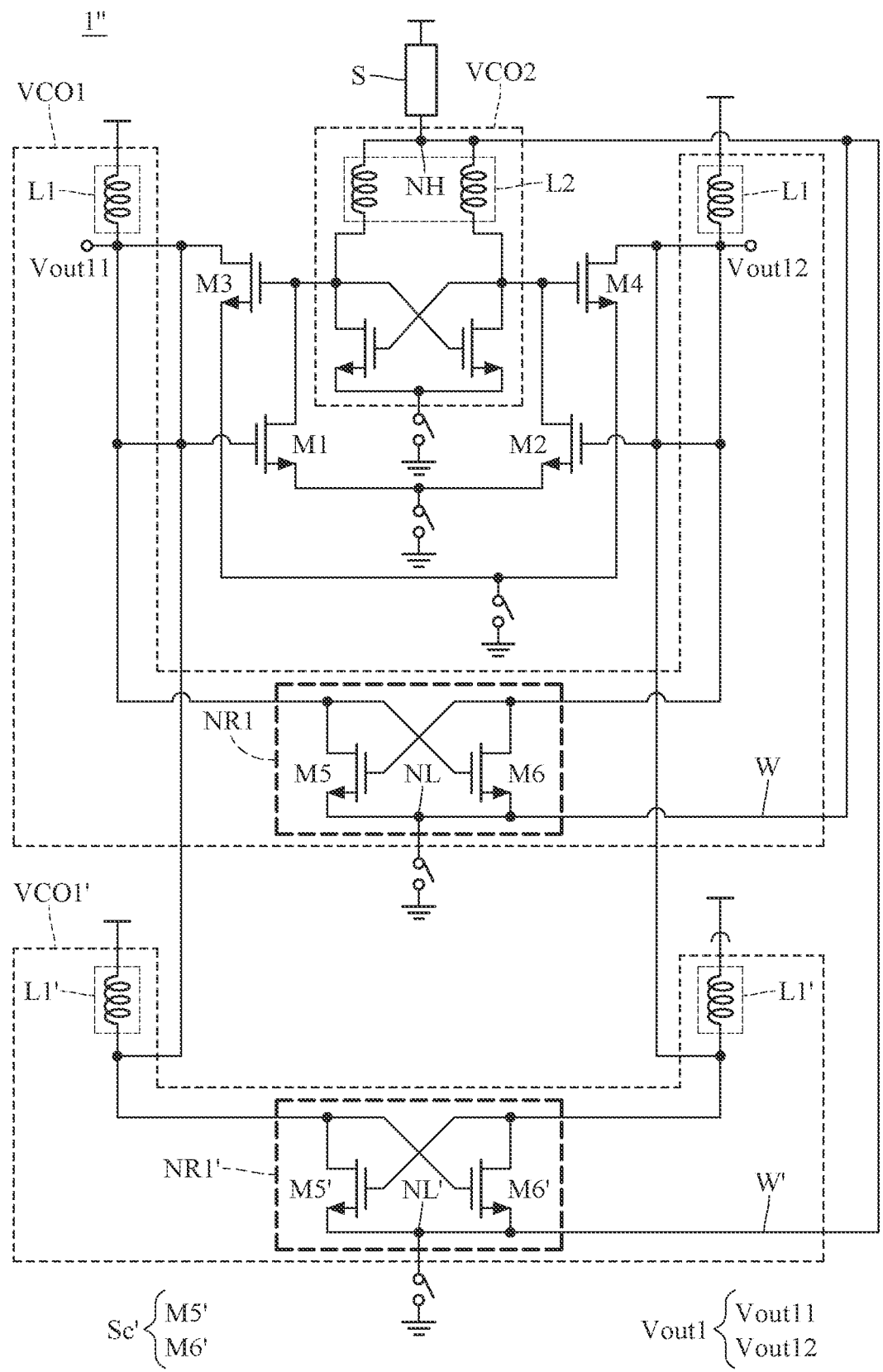
FIG. 5 is a circuit diagram illustrating a voltage-controlled oscillator device according to yet another embodiment of the present disclosure.

Please then refer to FIG. 5. FIG. 5 is a circuit diagram illustrating a voltage-controlled oscillator device according to yet another embodiment of the present disclosure. The voltage-controlled oscillator device 1″ shown in FIG. 5 further includes another first voltage-controlled oscillator VCO1′, wherein the first voltage-controlled oscillators VCO1 and VCO1′ are connected in parallel, and the structure of the first voltage-controlled oscillator VCO1 is the same with or similar to the structure of the first voltage-controlled oscillator VCO1′. The first voltage-controlled oscillator VCO1′ also at least includes an inductor group and a negative resistance circuit. The first voltage-controlled oscillator VCO1′ includes another first inductor group L1′ and another first negative resistance circuit NR1′. Another second voltage terminal NL′ of the first negative resistance circuit NR1′ of the first voltage-controlled oscillator VCO1′ is electrically connected to the first voltage terminal NH of the second inductor group L2. Specifically, the third switch group Sc′ includes two third switches M5′, M6′. Two third control terminals of the third switches M5′, M6′ are respectively electrically connected to the third input terminals of each other, and two third input terminals of the third switches M5′, M6′ are further electrically connected to the first voltage output terminal group Vout1 (that is, the third input terminal of the third switch M5′ and the first control terminal of the first switch M1 are electrically connected to the same first positive voltage output terminal, the third input terminal of the third switch M6′ and the first control terminal of the first switch M2 are electrically connected to the same first negative voltage output terminal). The third output terminal of the third switch M5′ and the third output terminal of the third switch M6′ are electrically connected and are selectively grounded or selectively electrically grounded, wherein one terminal that the two third output terminals of the third switches M5′, M6′ and the ground are electrically connected to is the second voltage terminal NL′. Said "the third output terminal of the third switch M5′ and the third output terminal of the third switch M6′ are electrically connected and are selectively grounded or selectively electrically grounded" may indicate the voltage of the third output terminal of the third switch M5′ and the voltage of the third output terminal of the third switch M6′ may be substantially the same. In an embodiment, when the third output terminal of the third switch M5′ and the third output terminal of the third switch M6′ are grounded (or electrically grounded), the first voltage-controlled oscillator VCO1′ is enabled. In an embodiment, the voltage-controlled oscillator device may include a plurality of (more than two) first voltage-controlled oscillators connected in parallel. All of the first voltage-controlled oscillators are electrically connected to the first voltage output terminal group Vout1, and these first voltage-controlled oscillators have corresponding frequencies, respectively. The corresponding frequencies of these the first voltage-controlled oscillators may be different. In an embodiment, the bandwidth of the voltage-controlled oscillator device and the numbers of oscillating frequencies may be increased.

The voltage-controlled oscillator device 1″ may have two wires W and W′. The wire W electrically connected to the second voltage terminal NL of the first negative resistance circuit NR1 and the first voltage terminal NH (for example, high voltage terminal) of the second inductor group L2. The wire W′ connected to the second voltage terminal NL′ (for example, low voltage terminal) of the first negative resistance circuit NR1′ and the first voltage terminal NH of the second inductor group L2. Accordingly, the bandwidth of the frequency doubler may be increased and the phase noise would not drop much.

In an embodiment not illustrated in the drawings, the voltage-controlled oscillator device may further include a plurality of first voltage-controlled oscillators VCO1 and/or a plurality of second voltage-controlled oscillators VCO2. The first voltage-controlled oscillators VCO1 are electrically connected to the first voltage output terminal group Vout1, and the second voltage-controlled oscillators VCO2 are electrically connected to the first voltage terminal NH.

Figure 6:
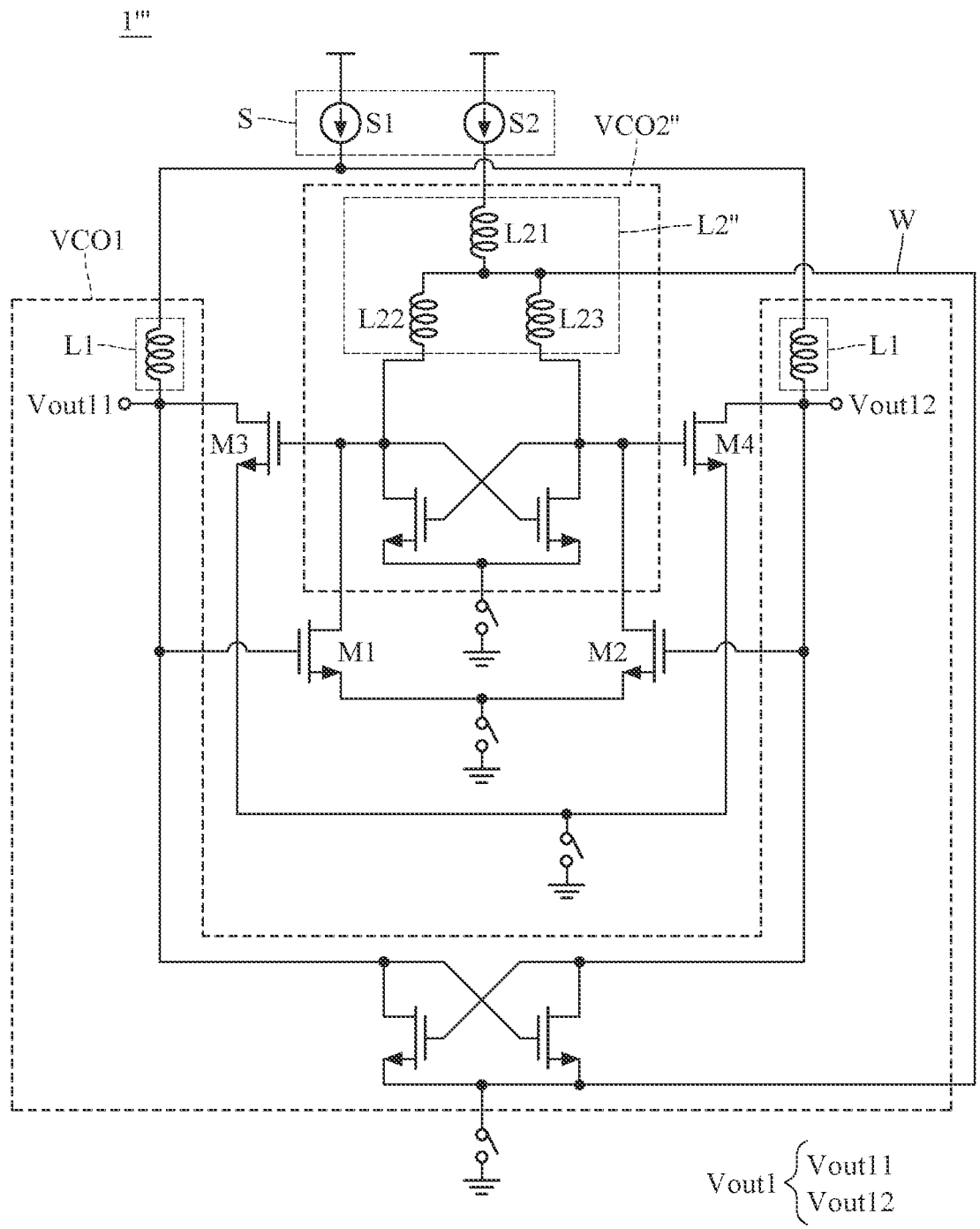
FIG. 6 is a circuit diagram illustrating a voltage-controlled oscillator device according to still another embodiment of the present disclosure.

Please refer to FIG. 6. FIG. 6 is a circuit diagram illustrating a voltage-controlled oscillator device according to still another embodiment of the present disclosure. The voltage-controlled oscillator device 1‴ shown in FIG. 6 is partially the same with or similar to the voltage-controlled oscillator device 1 shown in FIG. 2. In the embodiment of FIG. 6, the second inductor group L2″ of the second voltage-controlled oscillator VCO2″ may include three inductors L21, L22, L23. The three inductors L21, L22, L23 of the second inductor group L2″ may be implemented by three independent inductors or by one independent inductor (the second inductor L21) and a symmetric inductor (symmetric inductors L22, L23). The second inductor L21 is electrically connected to the first voltage terminal NH and the symmetric inductors L22, L23. In an embodiment, the first inductor group and/or the second inductor group may be implemented by various independent inductors or integrated inductors, the present disclosure is not limited thereto. Further, the first inductor group L1 may be electrically connected to the first the power input source S1, and the second inductor L21 may be connected to the second the power input source S2 to form the first voltage terminal NH. The signal received by the first inductor group L1 from the first the power input source S1 and the signal received by the second inductor group L2″ from the second the power input source S2 may have the same frequency or different frequencies, the same voltage value or different voltage values and/or the same current value or different current values etc.

In view of the above description, the voltage-controlled oscillator device according to one or more embodiment of the present disclosure may reduce the overall volume/area of a voltage-controlled oscillator device while increasing the bandwidth and oscillation frequency of the differential output signal, and may reduce the loss generated during the process of switching frequencies. In addition, the voltage-controlled oscillator device according to one or more embodiment of the present disclosure may allow the voltage-controlled oscillator device to have the functions of a buffer and a frequency doubler and properly reduce the phase noise. Further, since the voltage-controlled oscillator device according to one or more embodiment of the present disclosure may not require a multiplexer for switching frequencies, the energy loss may be reduced and the problem of excess inductance generating Q value may be avoided. In the case of without a need to additionally dispose a plurality of voltage-controlled oscillators, multiplexers and buffers, the voltage-controlled oscillator device according to one or more embodiment of the present disclosure may effectively reduce the occupied area and wiring length of the voltage-controlled oscillator device on the circuit.

What is claimed is:

1. A voltage-controlled oscillator device, comprising:
a first voltage-controlled oscillator at least comprising a first inductor group, a first negative resistance circuit, and a first voltage output terminal group, wherein the first voltage output terminal group is located between the first inductor group and the first negative resistance circuit;
a second voltage-controlled oscillator at least comprising a second inductor group, a second negative resistance circuit, and a second voltage output terminal group, wherein the second voltage output terminal group is located between the second inductor group and the second negative resistance circuit;
a first switch group comprising two first switches, each of the two first switches comprising a first control terminal, a first input terminal and a first output terminal, wherein the two first control terminals are electrically connected to the first voltage output terminal group, the two first input terminals are electrically connected to the second voltage output terminal group, and the two first output terminals are electrically connected and selectively electrically grounded; and
a second switch group comprising two second switches, each of the two second switches comprising a second control terminal, a second input terminal and a second output terminal, wherein the two second control terminals are electrically connected to the second voltage output terminal group, the two second input terminals are electrically connected to the first voltage output terminal group, and the two second output terminals are electrically connected and selectively electrically grounded,
wherein a first voltage terminal of the second inductor group is electrically connected to a second voltage terminal of the first negative resistance circuit; and
another first voltage-controlled oscillator, wherein a third voltage terminal of another first negative resistance circuit of the another first voltage-controlled oscillator is electrically connected to the first voltage terminal of the second inductor group.

2. The voltage-controlled oscillator device according to claim 1, wherein a terminal of the second inductor group is electrically connected to a power input source is the first voltage terminal.

3. The voltage-controlled oscillator device according to claim 1, further comprising a third voltage-controlled oscillator, wherein a third negative resistance circuit of the— third voltage-controlled oscillator is electrically connected to the first voltage output terminal group through the second switch group.

4. The voltage-controlled oscillator device according to claim 3, wherein the third voltage-controlled oscillator comprises a third inductor group, and the third inductor group is electrically connected to the third negative resistance circuit.

5. The voltage-controlled oscillator device according to claim 3, wherein the second voltage-controlled oscillator and the third voltage-controlled oscillator are connected in parallel.

6. The voltage-controlled oscillator device according to claim 1, wherein the another first voltage-controlled oscillator comprises another first inductor group, and the another first inductor group is electrically connected to the first voltage output terminal group and the another first negative resistance circuit.

7. The voltage-controlled oscillator device according to claim 1, wherein the first voltage-controlled oscillator and the another first voltage-controlled oscillator are connected in parallel.

8. The voltage-controlled oscillator device according to claim 1, wherein the first inductor group comprises two first inductors, a terminal of respective one of the two first inductors is electrically connected to the first voltage output terminal group, and another terminal of respective one of the two first inductors have voltages that are substantially the same.

9. The voltage-controlled oscillator device according to claim 1, wherein the first negative resistance circuit comprises a third switch group, the third switch group comprises two third switches, each of the third switches comprises a third input terminal and a third output terminal, the two third output terminals of the third switch group are electrically connected and are selectively electrically grounded, and the two third input terminals of the third switch group are electrically connected to the first voltage output terminal group.

10. The voltage-controlled oscillator device according to claim 9, wherein the two third output terminals of the third switch group are electrically connected to the second voltage terminal.

11. The voltage-controlled oscillator device according to claim 9, wherein each of the two third switches further comprises a third control terminal, and the third control terminal of one of the two third switches is electrically connected to the third input terminal of the other one of the two third switches.

12. The voltage-controlled oscillator device according to claim 1, wherein the second negative resistance circuit comprises a third switch group, the third switch group comprises two fourth switches, each of the fourth switches comprises a fourth input terminal and a fourth output terminal, the two fourth output terminals of the third switch group are electrically connected and are selectively electrically grounded, and the two fourth input terminals of the third switch group are electrically connected to the second voltage output terminal group.

13. The voltage-controlled oscillator device according to claim 12, wherein each of the two fourth switches further comprises a fourth control terminal, and the fourth control terminal of one of the two fourth switches is electrically connected to the fourth input terminal of the other one of the two fourth switches.

* * * * *